(12) United States Patent
Kitamura et al.

(10) Patent No.: US 8,223,886 B2
(45) Date of Patent: Jul. 17, 2012

(54) TRANSMISSION CIRCUIT FOR BIAS CONTROL OF POWER AMPLIFIER

(75) Inventors: Ryo Kitamura, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 604 days.

(21) Appl. No.: 12/472,674

(22) Filed: May 27, 2009

(65) Prior Publication Data

US 2009/0296855 A1 Dec. 3, 2009

(30) Foreign Application Priority Data

May 28, 2008 (JP) ................. 2008-139433

(51) Int. Cl.
H03C 3/00 (2006.01)
H03K 7/06 (2006.01)
H04L 27/12 (2006.01)
(52) U.S. Cl. ...................... 375/297; 375/302
(58) Field of Classification Search .......... 375/345, 375/346, 302, 296; 330/149, 10, 127
See application file for complete search history.

(56) References Cited

U.S. PATENT DOCUMENTS

| 7,944,994 B2* | 5/2011 | Matsuura et al. | 375/302 |
| 2001/0026600 A1* | 10/2001 | Mochizuki et al. | 375/345 |
| 2007/0165744 A1* | 7/2007 | Ishida | 375/296 |

FOREIGN PATENT DOCUMENTS

JP 5-110348 4/1993

* cited by examiner

Primary Examiner — David C. Payne
Assistant Examiner — Wednel Cadeau
(74) Attorney, Agent, or Firm — Wenderoth Lind & Ponack, L.L.P.

(57) ABSTRACT

A transmission circuit switches a bias circuit without allowing a power amplifier to enter a non-bias state. A first bias circuit supplies a first bias signal to a power amplifier, and a second bias circuit supplies a second bias signal to the power amplifier. A first delay circuit delays the switching of an operation of the first bias circuit using a first delay time, and a second delay circuit delays the switching of an operation of the second bias circuit using a second delay time. The first bias circuit and the second bias circuit are both simultaneously operated for a predefined time period, in order to prevent a transistor for amplification from entering a non-bias state when switching an operation mode of the power amplifier.

3 Claims, 15 Drawing Sheets

FIG. 3A

| POWER INFORMATION Sp | OPERATION MODE |
|---|---|
| P1 | MODE 1 |
| P2 | MODE 1 |
| P3 | MODE 2 |
| P4 | MODE 2 |
| ⋮ | ⋮ |

FIG. 3B

| MODE SWITCHING SIGNAL $S_M(N)$ | BIAS CIRCUIT |
|---|---|
| $S_M(1)$ | FIRST BIAS CIRCUIT |
| $S_M(2)$ | SECOND BIAS CIRCUIT |

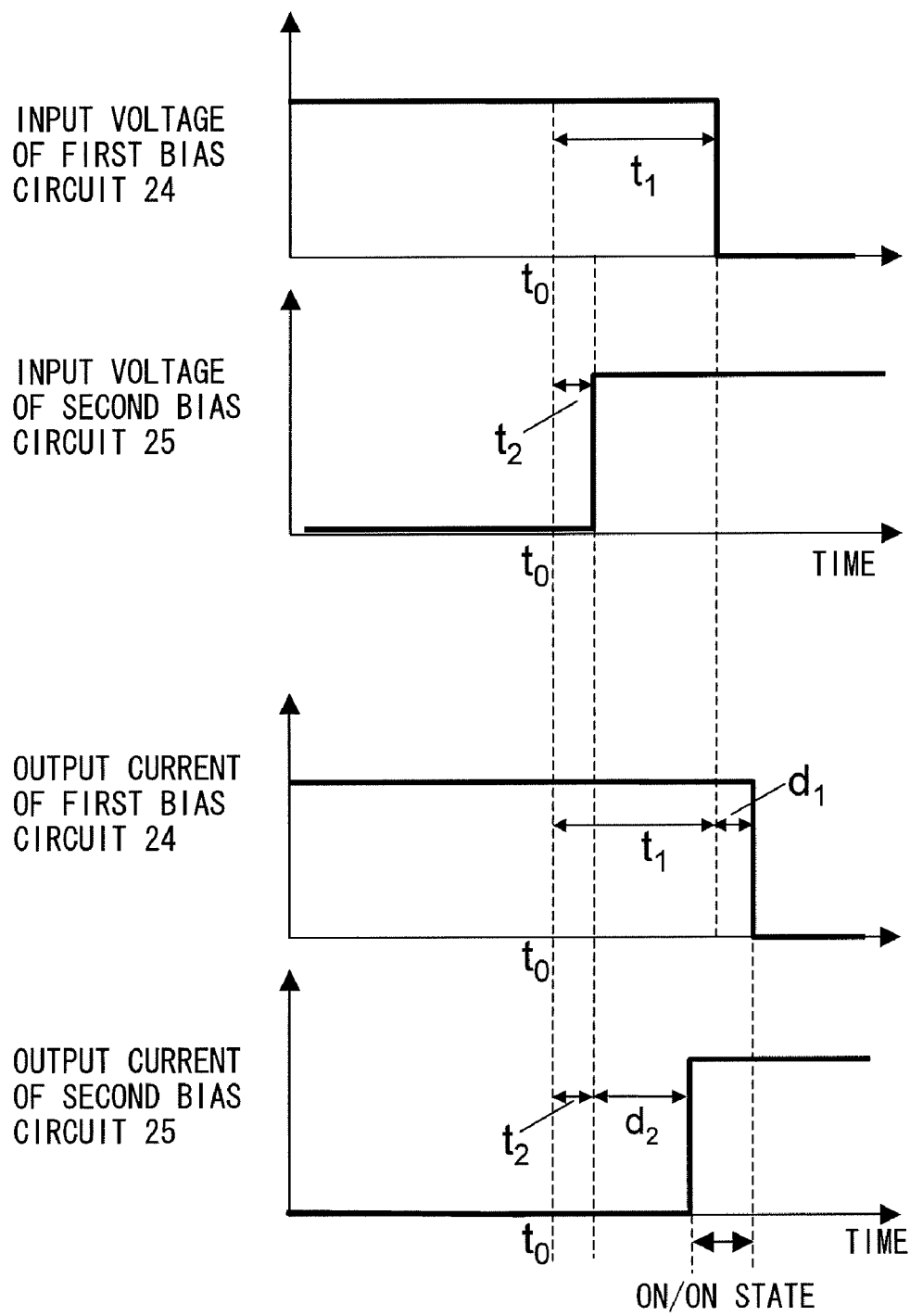

FIG. 7A

| POWER INFORMATION Sp | OPERATION MODE |
|---|---|
| P1 | NON-COMPRESSED MODE |
| P2 | NON-COMPRESSED MODE |
| P3 | COMPRESSED MODE |
| P4 | COMPRESSED MODE |
| ⋮ | ⋮ |

FIG. 7B

| MODE SWITCHING SIGNAL $S_M(N)$ | BIAS CIRCUIT |
|---|---|
| $S_M(1)$ | FIRST BIAS CIRCUIT |
| $S_M(2)$ | SECOND BIAS CIRCUIT |

TRANSMISSION CIRCUIT FOR BIAS CONTROL OF POWER AMPLIFIER

BACKGROUND OF THE INVENTION

1. Field of the Invention

The present invention relates to a transmission circuit that is utilized in a communication device such as a mobile phone, a wireless LAN, and the like. More specifically, the present invention relates to a transmission circuit that conducts bias control of a power amplifier.

2. Description of the Background Art

In recent years, in a highly information-oriented society, a communication device such as a mobile phone, a wireless LAN, and the like, have to ensure a linear transmission signal in a broad power amplification range while achieving low power consumption. Adopted in such communication device is a transmission circuit which outputs a transmission signal with high precision regardless of the operation bandwidth and which operates with high efficiency. A conventional transmission circuit is described in the following.

As a conventional transmission circuit, for example, there has been a transmission circuit that generates a transmission signal by utilizing a modulation method such as orthogonal modulation and the like (hereinafter, referred to as an orthogonal modulation circuit). The orthogonal modulation circuit is widely known, therefore description thereof is omitted. Furthermore, a transmission circuit 50 shown in FIG. 10 is an example of a conventional transmission circuit that operates with higher precision and higher efficiency than the orthogonal modulation circuit. FIG. 10 is a block diagram showing one configuration example of the conventional transmission circuit 50. In FIG. 10, the conventional transmission circuit 50 includes: a signal generator 501; a phase modulator 502; a regulator 503; a power amplifier 504; and a power supply terminal 505. The power amplifier 504 includes a transistor for amplification.

In the conventional transmission circuit 50, the signal generator 501 generates an amplitude signal and a phase signal. The amplitude signal is inputted into the regulator 503. Furthermore, a DC voltage is supplied from the power supply terminal 505 to the regulator 503. The regulator 503 supplies a voltage to the power amplifier 504 depending on the amplitude signal inputted into the regulator 503. Typically, the regulator 503 supplies the power amplifier 504 with a voltage that is proportional to the level of the inputted amplitude signal.

On the other hand, the phase signal is inputted into the phase modulator 502. The phase modulator 502 conducts a phase modulation on the phase signal, and outputs a phase modulation signal. The phase modulation signal is inputted into the power amplifier 504. The power amplifier 504 conducts an amplitude modulation on the phase modulation signal by using the voltage supplied by the regulator 503, and outputs the resulting signal as a modulation signal that has been phase modulated and amplitude modulated. This modulation signal is outputted from an output terminal as a transmission signal. Such transmission circuit 50 is called a polar modulation circuit.

Although the transmission circuit 50 described above can operate with high precision and high efficiency, the transmission circuit 50 requires further reduction in power consumption if being used as a mobile wireless device. In particular, in the transmission circuit 50 described above, since a large part of the power is consumed by the power amplifier 504 which is a part that conducts power amplification of an output, reduction in power consumption of the power amplifier 504 is required.

One example of an approach to reduce power consumption of a power amplifier, not limited to a polar modulation circuit, is a bias control technology disclosed in Japanese Laid-Open Patent Publication No. H5-110348 (hereinafter, referred to as patent document 1). Patent document 1 discloses a high-frequency wave amplifier that switches a bias voltage by using a bias-switching switch in accordance with an operation condition of the power amplifier. In general, since amplification of an analog FM modulated wave only requires transmission of a phase change, a usage of a class-C power amplifier that has high power conversion efficiency is preferred. On the other hand, in the case of a modulation method for a digitally modulated wave, for example a π/4 shifted QPSK modulated wave, transmission of both amplitude and phase change is required, thus, a usage of a class-A power amplifier having a fine linearity is necessary. Patent document 1 discloses a configuration that allows control of an operation range of the power amplifier by switching the bias voltage applied on a transistor for amplification, depending on the modulation signal.

FIG. 11 is a block diagram showing one configuration example of a transmission circuit 51 that uses a conventional high-frequency wave amplifier. In FIG. 11, a modulated wave inputted from a RF input terminal 511 is amplified by a power amplifier 512, and outputted from an antenna 513. The power amplifier 512 includes: a transistor for amplification 518 that is emitter grounded; an input side matching section 517 connected to a base of the transistor for amplification 518; and an output side matching section connected to a collector of the transistor for amplification 518.

A switching control circuit 515 is connected, through a bias-switching switch 520, to the base of the transistor for amplification 518 which is a component of the power amplifier 512. The bias-switching switch 520 is connected to the base of the transistor for amplification 518 on either a first bias circuit 522 side or a second bias circuit 523 side, depending on a control signal which is for modulated wave selection and which is inputted from a control signal input terminal 514. More specifically, the bias-switching switch 520 is connected to the base of the transistor for amplification 518 on the first bias circuit 522 side when the power amplifier 512 functions as a class-C power amplifier. On the other hand, the bias-switching switch 520 is connected to the base of the transistor for amplification 518 on the second bias circuit 523 side when the power amplifier 512 operates as a class-A power amplifier. As described above, the conventional transmission circuit 51 converts the operation range of the power amplifier 512 by switching the bias circuit depending on the type of the modulated wave of which the power amplifier 512 amplifies, thus enabling improvement in power conversion efficiency of the conventional transmission circuit 51.

However, in the conventional transmission circuit 51, when switching between the first bias circuit 522 and the second bias circuit 523, a state in which a bias is not applied (non-bias) to the power amplifier 512 can be generated, because of a delay in switching operation during a bias circuit switching, or because of a delaying element that exists in a control signal pathway.

The switching operation during the bias circuit switching is described with reference to FIG. 12. FIG. 12(a) shows a change in a bias voltage when a control signal is inputted into the control signal input terminal 514 at time $t_0$ and the first bias circuit 522 is switched to the second bias circuit 523. In FIG. 12(a), when comparing before time $t_0$ and after time $t_0$, the bias voltage changes from $V_1$ to $V_2$ in a step-like way due to the control signal inputted into the control signal input terminal 514.

FIG. 12(b) shows one example of a delay that is generated in a bias current which is applied to a bias control terminal of the transistor for amplification 518. As shown in FIG. 12(b), a delay in the switching operation of the bias current which is applied to the bias control terminal of the transistor for amplification 518 is generated, due to influences of a delay characteristic of the bias-switching switch 520 and a delaying element that exists in a transmission pathway of a communication information signal. In this example, delay time from the time $t_0$ when the control signal is inputted into the control signal input terminal 514 up to the time when the first bias circuit 522 is switched from on to off is defined as $d_1$, and up to the time when the second bias circuit 523 is switched from off to on is defined as $d_2$ ($d_2 > d_1$). In this case, during a time period of $T_1 = d_2 - d_1$, both the first bias circuit 522 and the second bias circuit 523 are off, and the transistor for amplification 518 is in a non-bias state.

Therefore, the above described transmission circuit 51 has a problem of not being able to conduct a smooth switching operation of the power amplifier 512, due to an interruption of the output signal of the power amplifier 512 during bias current switching, since the transistor for amplification 518 does not conduct a normal operation in a non-bias state.

Furthermore, even if the bias control technology disclosed in patent document 1 is applied to the transmission circuit 50 (polar modulation circuit) described above, the transistor for amplification that includes the power amplifier 504 cannot be prevented from entering a non-bias state.

SUMMARY OF THE INVENTION

Therefore, an objective of the present invention is to solve the above-described conventional problem, by providing a transmission circuit that is capable of conducting bias control without allowing a power amplifier to enter a non-bias state when changing an operation mode of the power amplifier during bias current switching.

One mode of the transmission circuit of the present invention includes: a signal generator that generates an amplitude signal and a phase signal; a first variable gain amplifier that amplifies the amplitude signal by a first gain; a regulator that outputs a voltage depending on the amplitude signal that is inputted via the first variable gain amplifier; a phase modulator that conducts phase modulation on the phase signal and outputs a phase modulation signal; a second variable gain amplifier that amplifies the phase modulation signal by a second gain; a power amplifier that outputs a transmission signal by amplifying the phase modulation signal inputted via the second variable gain amplifier depending on the voltage outputted from the regulator; a first bias circuit that supplies the power amplifier with a first bias signal; a second bias circuit that supplies the power amplifier with a second bias signal; a bias controller that controls operations of the first bias circuit and the second bias circuit; a mode-switching decision section that decides whether or not to switch an operation mode of the power amplifier based on power information; a mode-switching controller that instructs the bias controller to switch between the operations of the first bias circuit and the second bias circuit depending on a decision of the mode-switching decision section; a first delay circuit that delays switching of an operation of the first bias circuit for a duration of a first delay time; and a second delay circuit that delays switching of an operation of the second bias circuit for a duration of a second delay time. The power amplifier includes a transistor for amplification which amplifies the phase modulation signal; and the first delay time and the second delay time are configured such that both the first bias circuit and the second bias circuit operate simultaneously for a predefined time period when switching the operation mode of the power amplifier.

As described above, by using the transmission circuit of the present invention, the transistor for amplification can be prevented from entering a non-bias state, by adjusting a switching timing of the bias circuit when switching the operation mode of the power amplifier. As a result, the transmission circuit can conduct the switching of the operation mode of the power amplifier smoothly, while preventing the output signal of the power amplifier from being interrupted when switching the operation mode of the power amplifier.

Furthermore, by adopting the above described transmission circuit, a communication device according to the present invention can operate with high efficiency while ensuring a precise output signal throughout a broad bandwidth.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a figure showing one example of a look-up table that describes a relationship between power information $S_p$ and an operation mode;

FIG. 3B is a look-up table that describes a relationship between a mode-switching signal $S_M(N)$ and a bias circuit;

FIG. 4A is a figure showing one example of a relationship between an input voltage and an output current of a first bias circuit 24 and a second bias circuit 25, when switched from the first bias circuit 24 to the second bias circuit 25;

FIG. 7A is a figure showing one example of a look-up table that describes a relationship between power information $S_p$ and an operation mode;

FIG. 7B is a look-up table that describes a relationship between a mode-switching signal $S_M(N)$ and a bias circuit;

DETAILED DESCRIPTION OF THE INVENTION

First Embodiment

Figure 1:
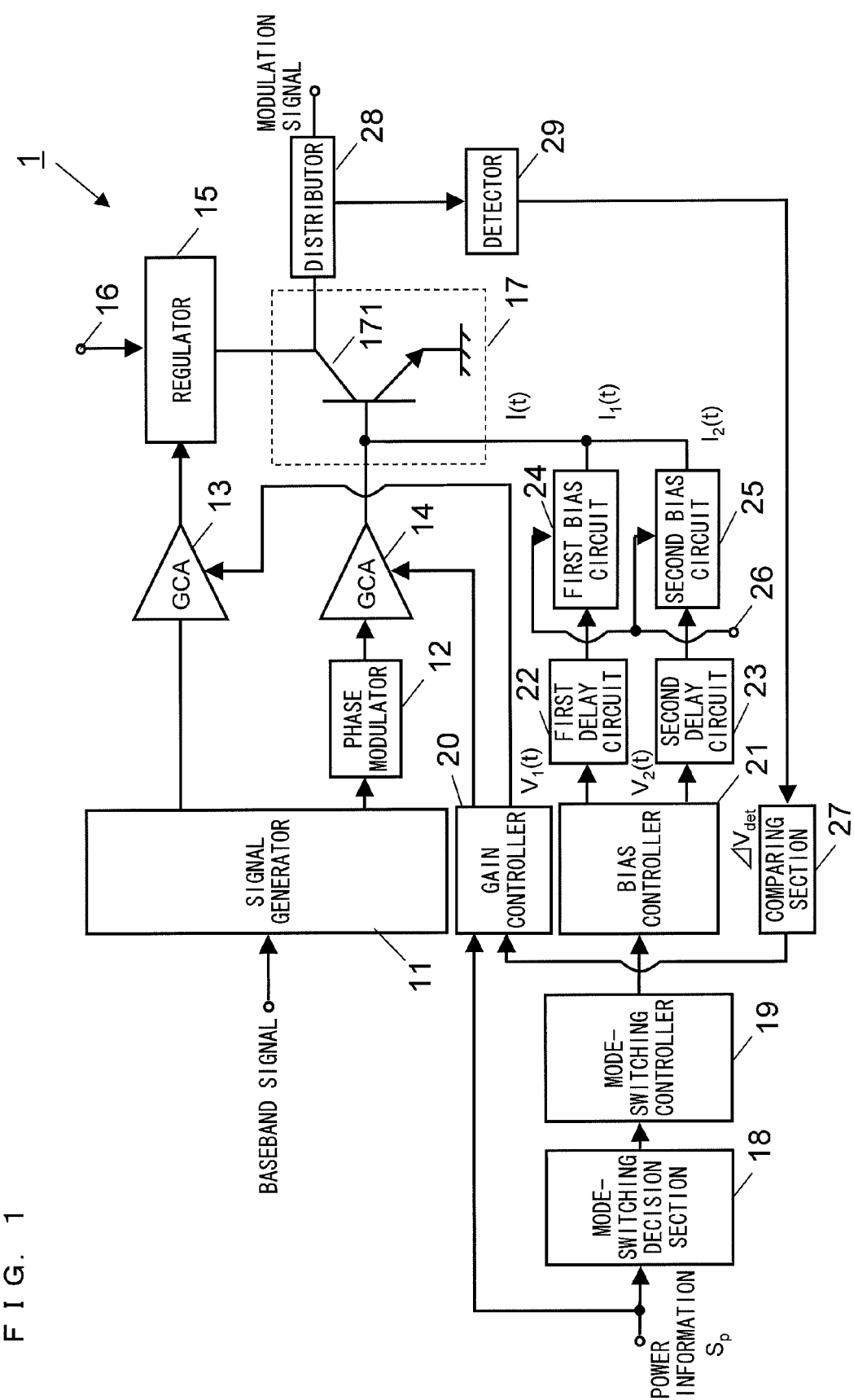
FIG. 1 is a block diagram showing one configuration example of a transmission circuit 1 according to a first embodiment of the present invention.

FIG. 1 is a block diagram showing one configuration example of a transmission circuit 1 according to a first embodiment of the present invention. The transmission circuit 1 in FIG. 1 includes: a signal generator 11; a phase modulator 12; a first variable gain amplifier (GCA) 13; a second variable gain amplifier (GCA) 14; a regulator 15; a power supply terminal 16; a power amplifier 17; a mode-switching decision section 18; a mode-switching controller 19; a gain controller 20; a bias controller 21; a first delay circuit 22; a second delay circuit 23; a first bias circuit 24; a second bias circuit 25; a power supply terminal 26; a comparing section 27; a distributor 28; and a detector 29. The power amplifier 17 includes a transistor for amplification 171.

In the transmission circuit 1, the signal generator 11 conducts a predefined signal processing on a baseband signal, and generates an amplitude signal and a phase signal. The amplitude signal is inputted into the regulator 15 via the first variable gain amplifier 13. In addition, a DC voltage is supplied to the regulator 15 via the power supply terminal 16. The regulator 15 supplies the power amplifier 17 with a voltage depending on the amplitude signal. Typically, the regulator 15 supplies the power amplifier 17 with a voltage that is proportional to the level of the amplitude signal.

Figure 2A:
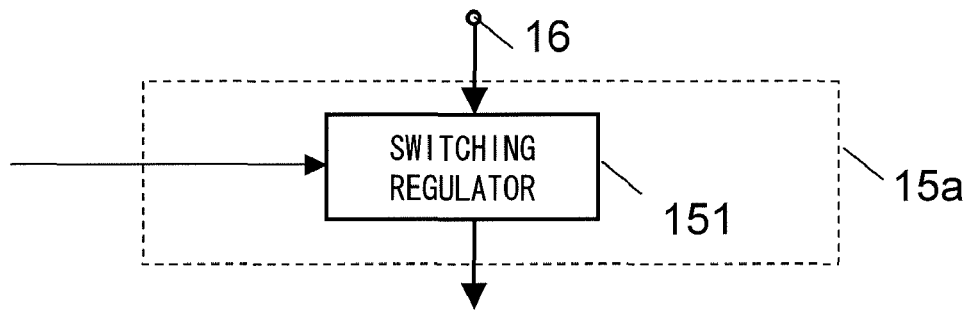
FIG. 2A is a block diagram showing a configuration of a regulator 15a that includes a switching regulator.
Figure 2B:
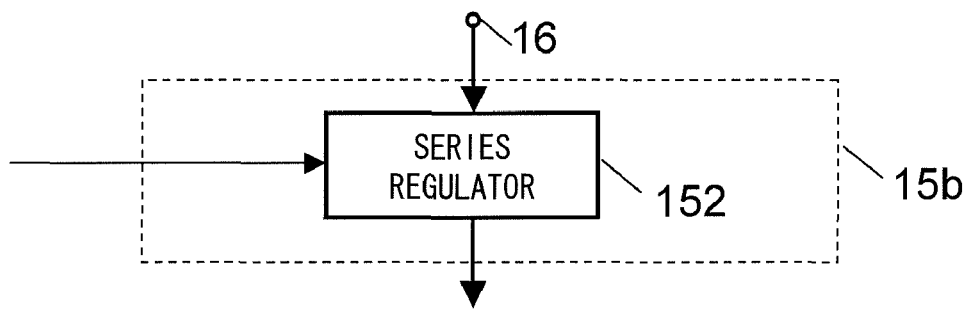
FIG. 2B is a block diagram showing a configuration of a regulator 15b that includes a series regulator.
Figure 2C:
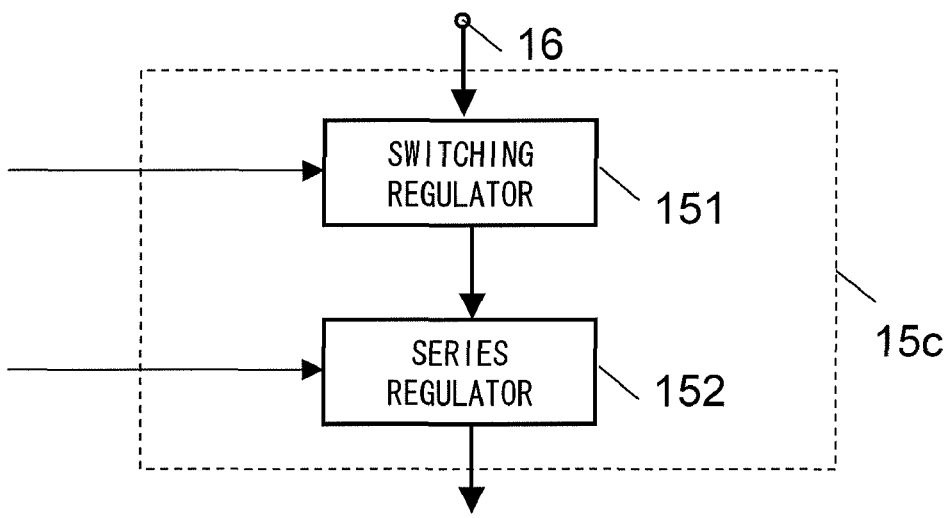
FIG. 2C is a block diagram showing a configuration of a regulator 15c that includes a switching regulator and a series regulator.

For example, the regulator 15 can be constructed by using a switching regulator 151, as in the case of a regulator 15a shown in FIG. 2A. Additionally, the regulator 15 can be constructed by using a series regulator 152, as in the case of a regulator 15b shown in FIG. 2B. Furthermore, as in the case of a regulator 15c shown in FIG. 2C, the regulator 15 can be constructed by combining the switching regulator 151 and the series regulator 152. In the regulator 15c, the switching regulator 151 transforms a DC voltage inputted from the power supply terminal 16 into a desired voltage, and supplies the resulting voltage to the series regulator 152. The series regulator 152 supplies the power amplifier 17 with a voltage depending on the amplitude signal, by amplifying the amplitude signal inputted through the first variable gain amplifier 13 using the voltage supplied from the switching regulator 151. Furthermore, the regulator 15 may have a configuration that uses an electric current driven type regulator.

On the other hand, the phase signal is inputted into the phase modulator 12. The phase modulator 12 conducts a phase modulation on the phase signal, and outputs a phase modulation signal. The phase modulation signal is inputted into the power amplifier 17 through the second variable gain amplifier 14. The power amplifier 17 conducts an amplitude modulation on the phase modulation signal by using the voltage supplied by the regulator 15, and outputs the resulting signal as a modulation signal that has been phase modulated and amplitude modulated. This modulation signal is outputted from an output terminal as a transmission signal.

The mode-switching decision section 18 decides whether or not to switch an operation mode of the power amplifier 17 depending on inputted power information $S_p$. Additionally, when the mode-switching decision section 18 decides to switch the operation mode, the mode-switching decision section 18 specifies the type of the operation mode that is going to be applied after switching. For example, by referencing a look-up table (for example, FIG. 3A) that describes a relationship between the power information $S_p$ and the operation mode, the mode-switching decision section 18 decides whether or not to switch the operation mode of the power amplifier 17, and specifies the type of the operation mode that is going to be applied after switching.

Furthermore, the mode-switching decision section 18 may decide whether or not to switch the operation mode of the power amplifier 17 by comparing a value of the power information $S_p$ to a predefined threshold. For example, the mode-switching decision section 18 can decide to operate the power amplifier 17: in an operation mode 1 if the value of the power information $S_p$ is less than the predefined threshold; or in an operation mode 2 if the value of the power information $S_p$ is equal to or more than the predefined threshold. The threshold that is compared to the power information $S_p$ is not limited to a single threshold, and a plurality of thresholds may be applied. If the number of the operation modes after switching is assumed as N, when the mode-switching decision section 18 decides to switch the operation mode, the mode-switching decision section 18 outputs a mode-switching signal $S_M(N)$, and supplies the mode-switching controller 19 with this mode-switching signal $S_M(N)$.

In the description above, the operation mode of the power amplifier 17 is, for example, defined by the operation range of the transistor for amplification 171 included in the power amplifier 17. The power information $S_p$ is power information that indicates a magnitude of the transmission power necessary for a communication with a base station; and, for example in a W-CDMA system, the power information $S_p$ is controlled by the base station. Transmission power control for the communication with the base station is conducted in every time slot period.

In the description above, the mode-switching decision section 18 decides to switch the operation mode of the power amplifier 17 based on the power information $S_p$; however, the mode-switching decision section 18 may decide to switch the operation mode of the power amplifier 17 based on any other type of information. For example, the mode-switching decision section 18 may decide to switch the operation mode of the power amplifier 17 based on information such as, the type of the modulation signal, temperature, and the like.

The mode-switching controller 19 switches the bias circuit to be operated, depending on a decision of the mode-switching decision section 18. For example, the mode-switching controller 19: determines the bias circuit that corresponds to the mode-switching signal $S_M(N)$ which is supplied by the mode-switching decision section 18, by using a look-up table (for example, refer FIG. 3B); and outputs a bias switching signal $S_B$. The mode-switching controller 19 outputs a bias switching signal $S_B(1)$ when the first bias circuit 24 is to be turned on, and outputs a bias switching signal $S_B(2)$ when the second bias circuit 25 is to be turned on.

In FIG. 1, a case where the number of the operation mode of the power amplifier 17 and the number of the bias circuit are equal is shown as an example; however, the number of the operation mode of the power amplifier 17 and the number of the bias circuit do not necessary have to be equal. For example, there may be five types of operation modes of the power amplifier 17, operation mode 1 to operation mode 5; and operation mode 1 to operation mode 3 may be utilized by the first bias circuit 24, while operation mode 4 and operation mode 5 may be utilized by the second bias circuit 25.

The bias controller 21 controls operations of the first bias circuit 24 and the second bias circuit 25, based on the inputted bias switching signal $S_B$. More specifically, the bias controller 21 supplies the first delay circuit 22 with an on/off signal $V_1(t)$ for controlling the first bias circuit 24, based on the inputted bias-switching signal $S_B$; and supplies the second delay circuit 23 with an on/off signal $V_2(t)$ for controlling the second bias circuit 25. For example, when the bias switching signal $S_B(1)$ is inputted, the bias controller 21 turns on the first bias circuit 24, and outputs the on/off signal $V_1(t)$ that satisfies $V_1(t) > V_{th1}$ and the on/off signal $V_2(t)$ that satisfies $V_2(t) < V_{th2}$ in order to turn off the second bias circuit 25.

Here, $V_{th1}$ and $V_{th2}$ are thresholds for defining the "on" state of the on/off signal $V_1(t)$ and the on/off signal $V_2(t)$, and arbitrary values may be adopted for these thresholds. Arbitrary voltage values may be adopted as the on/off signal $V_1(t)$ and the on/off signal $V_2(t)$, as long as these signals obtain the objective of controlling the on/off of the bias circuit. Furthermore, depending on the type of the bias circuit, current values may be adopted as the on/off signal $V_1(t)$ and the on/off signal $V_2(t)$.

The first delay circuit 22 delays the switching of the first bias circuit 24 for a predefined time $t_1$. The second delay circuit 23 delays the switching of the second bias circuit 25 for a predefined time $t_2$. More specifically, the first delay circuit 22 delays the on/off signal $V_1(t)$ for the predefined time $t_1$. Similarly, the second delay circuit 23 delays the on/off signal $V_2(t)$ for the predefined time $t_2$. These times $t_1$ and $t_2$ are adjusted so the transistor for amplification 171 does not enter a non-bias state when conducting the operation mode switching of the power amplifier 17. $d_1$ is a delay time that elapses when an electrical signal travels through a pathway from the bias controller 21 to a base terminal of the transistor for amplification 171 via the first bias circuit 24, including the first delay circuit 22. Additionally, $d_2$ is a delay time that elapses when an electrical signal travels through a pathway from the bias controller 21 to the base terminal of the transistor for amplification 171 via the second bias circuit 25, including the second delay circuit 23.

As a result, $t_1 + d_1$ is a delay time that elapses when an electrical signal travels through a pathway from the bias controller 21 to the base terminal of the transistor for amplification 171 via the first bias circuit 24, including the first delay circuit 22. Similarly, $t_2 + d_2$ is a delay time that elapses when an electrical signal travels through a pathway from the bias controller 21 to the base terminal of the transistor for amplification 171 via the second bias circuit 25, including the second delay circuit 23. Therefore, in order to prevent the transistor for amplification 171 from entering a non-bias state when switching from the first bias circuit 24 to the second bias circuit 25; a condition, $t_1 + d_1 > t_2 + d_2$, has to be satisfied. At this condition, a relationship between the input power and the output current of the first bias circuit 24 and the second bias circuit 25 will be, for example, as shown in FIG. 4A.

Figure 4B:
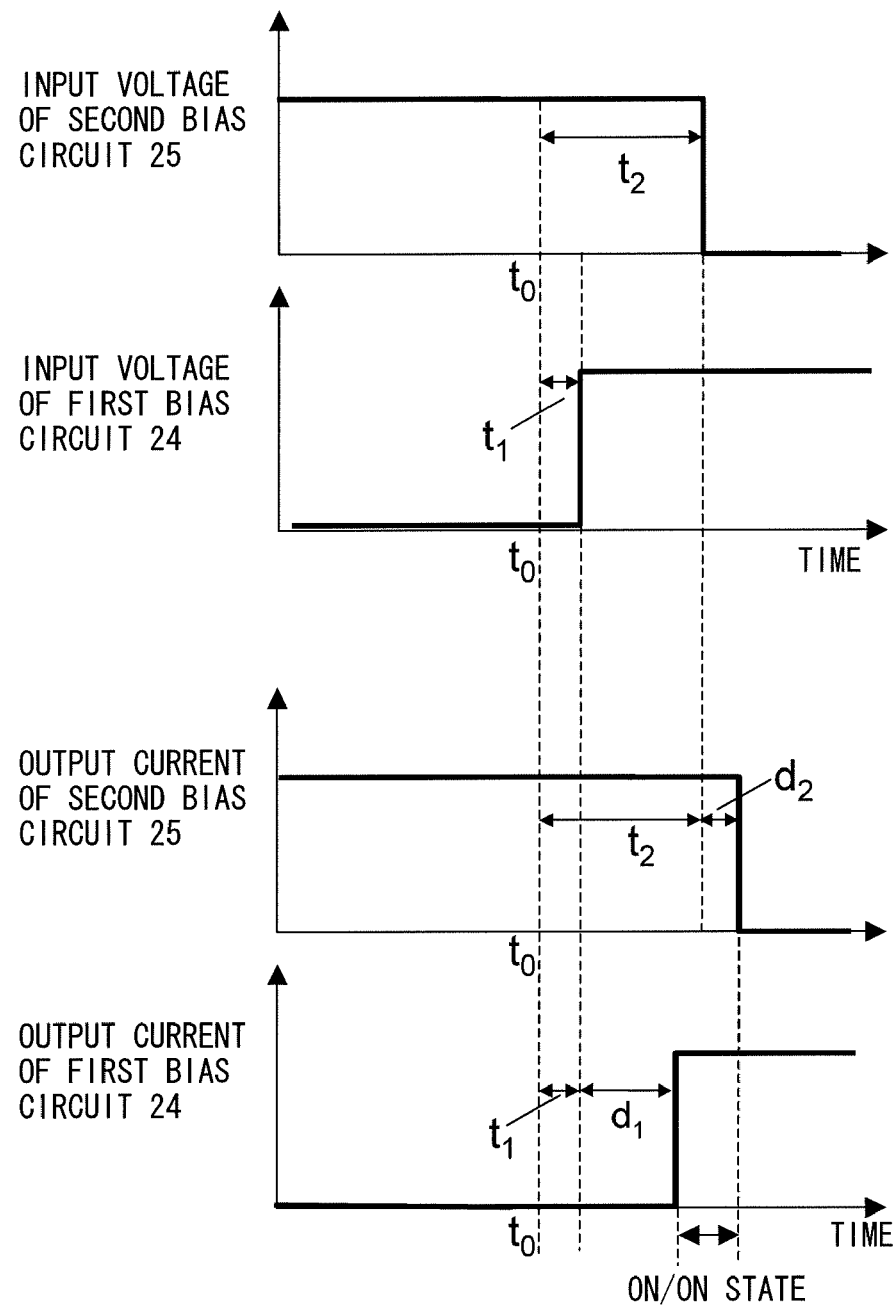
FIG. 4B is a figure showing one example of a relationship between the input voltage and the output current of the first bias circuit 24 and the second bias circuit 25, when switched from the second bias circuit 25 to the first bias circuit 24.

Conversely, in order to prevent the transistor for amplification 171 from entering a non-bias state when switching from the second bias circuit 25 to the first bias circuit 24; a condition, $t_1 + d_1 < t_2 + d_2$, has to be satisfied. At this condition, a relationship between the input power and the output current for the first bias circuit 24 and the second bias circuit 25 will be, for example, as shown in FIG. 4B.

Since values of the delay time $d_1$ and the delay time $d_2$ change due to variability in circuit elements, temperature changes, and the like; when the minimum value of the delay time $d_1$ is defined as $\min(d_1)$ and the maximum value of the delay time $d_2$ is defined as $\max(d_2)$, it is necessary to configure the delay time $d_1$ and the delay time $d_2$ to satisfy $t_1 + \min(d_1) > t_2 + \max(d_2)$ when switching from the first bias circuit 24 to the second bias circuit 25. Conversely, when the maximum value of the delay time $d_1$ is defined as $\max(d_1)$ and the minimum value of the delay time $d_2$ is defined as $\min(d_2)$, it is necessary to configure the delay time $d_1$ and the delay time $d_2$ to satisfy $t_1 + \max(d_1) < t_2 + \min(d_2)$ when switching from the second bias circuit 25 to the first bias circuit 24.

Figure 4C:
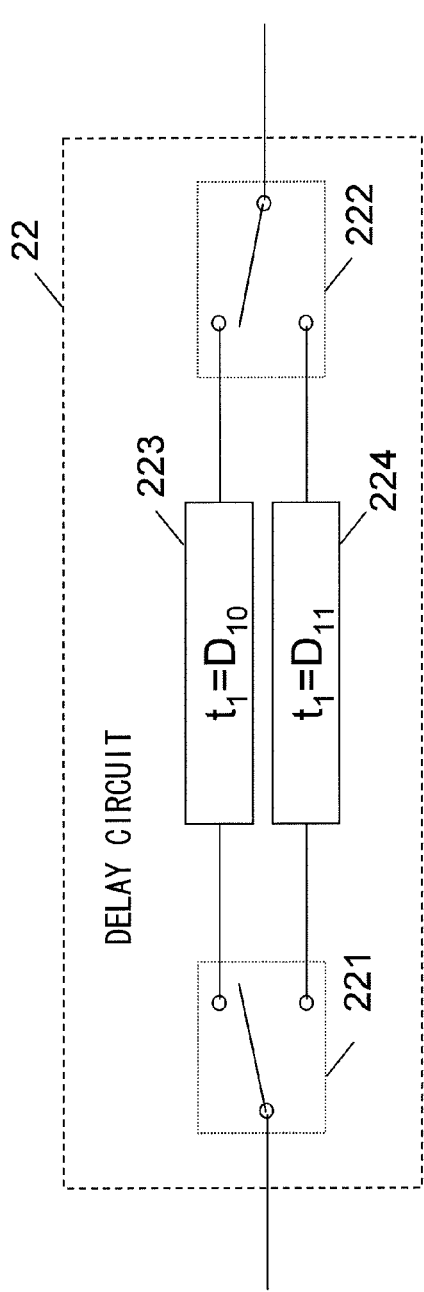
FIG. 4C is a block diagram showing one configuration example of a first delay circuit 22.

FIG. 4C is a block diagram showing one configuration example of the first delay circuit 22. In FIG. 4C, the first delay circuit 22 includes: a first high-speed switch 221; a second high-speed switch 222; a first transmission line 223; and a second transmission line 224. The first transmission line 223 is a low-delay transmission line, and a delay time of the first transmission line 223 is $D_{10}$. On the other hand, the second transmission line 224 is a high-delay transmission line, and a delay time of the second transmission line 224 is $D_{11}$. The delay time $t_1$ is configured to be $D_{10}$ or $D_{11}$ as a result of switching conducted by high-speed switches 221 and 222.

Figure 4D:
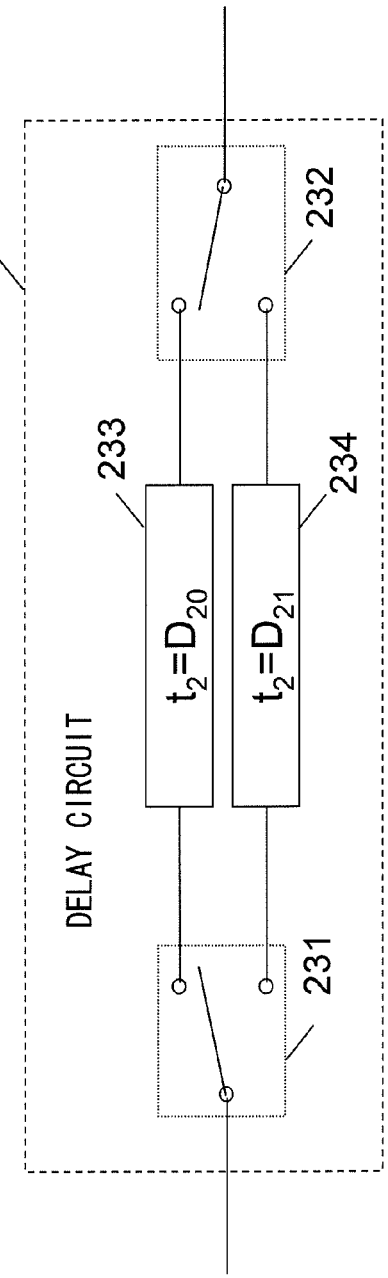
FIG. 4D is a block diagram showing one configuration example of a second delay circuit 23.

FIG. 4D is a block diagram showing one configuration example of the second delay circuit 23. In FIG. 4D, the second delay circuit 23 includes: a first high-speed switch 231; a second high-speed switch 232; a first transmission line 233; and a second transmission line 234. The first transmission line 233 is a low-delay transmission line, and a delay time of the first transmission line 233 is $D_{20}$. On the other hand, the second transmission line 234 is a high-delay transmission line, and a delay time of the second transmission line 234 is $D_{21}$. The delay time $t_2$ is configured to be $D_{20}$ or $D_{21}$ as a result of switching conducted by high-speed switches 231 and 232.

A configuration of $t_1 = D_{11}$, $t_2 = D_{20}$, is applied when switching from the first bias circuit 24 to the second bias circuit 25; and a configuration of $t_1 = D_{10}$, $t_2 = D_{21}$, is applied when switching from the second bias circuit 25 to the first bias circuit 24. The transmission lines are designed such that $D_{11}$ satisfies $(D_{11} - D_{20}) > \max(d_2) - \min(d_1)$, and $D_{21}$ satisfies $(D_{21} - D_{10}) > \max(d_1) - \min(d_2)$.

After the bias circuit switching is conducted, the values of $t_1$ and $t_2$ are reconfigured in preparation of the next switching. For example, a configuration of $t_1 = D_{10}$, $t_2 = D_{21}$, is applied, after switching from the first bias circuit 24 to the second bias circuit 25. By controlling the delay time as described above, at least one bias circuit, either the first bias circuit 24 or the second bias circuit 25, is constantly turned on; preventing the transistor for amplification 171 from entering a non-bias state.

In the case where the transistor for amplification 171 can be prevented from entering a non-bias state when $t_1 = 0$; the first delay circuit 22 does not have to be included in the transmission circuit 1. Similarly, in the case where the transistor for amplification 171 can be prevented from entering a non-bias state when $t_2 = 0$; the second delay circuit 23 does not have to be included in the transmission circuit 1.

Furthermore, an advantageous effect similar to those described above can be obtained if the first delay circuit 22 is installed in between an output terminal of the first bias circuit 24 and the base terminal of the transistor for amplification 171 in the power amplifier 17. In the same manner, an advantageous effect similar to those described above can be obtain if the second delay circuit 23 is installed in between an output terminal of the second bias circuit 25 and the base terminal of the transistor for amplification 171 in the power amplifier 17.

A DC voltage is supplied from the power supply terminal 26 to the first bias circuit 24 and to the second bias circuit 25. When an on/off signal $V_1(t-t_1)$ supplied by the first delay circuit 22 is larger than the threshold $V_{th1}$ where the first bias circuit 24 is turned on, the first bias circuit 24 supplies a bias current (bias signal) to the base terminal of the transistor for amplification 171 in the power amplifier 17. In the same manner, when an on/off signal $V_2(t-t_2)$ supplied by the second delay circuit 23 is larger than the threshold $V_{th2}$ where the second bias circuit 25 is turned on, the second bias circuit 25 supplies a bias current (bias signal) to the base terminal of the transistor for amplification 171 in the power amplifier 17.

If the transistor for amplification 171 in the power amplifier 17 is a FET or the like, the first bias circuit 24 and the second bias circuit 25 may supply the base terminal of the transistor for amplification 171 with a bias voltage (bias signal).

Described next is an operation of a loop that includes the distributor 28, the detector 29, the comparing section 27, and the gain controller 20 (hereinafter, referred to as a power control loop). When switching the operation mode of the power amplifier 17, the power control loop conducts an operation to prevent an output power of the transmission circuit 1 (i.e. power amplifier 17) from fluctuating discontinuously. In this case, for example, the power information $S_p$ is inputted into the detector 29. The detector 29 detects a switching timing of the operation mode of the power amplifier 17 based on the power information $S_p$. The detector 29 may detect the switching timing of the operation mode of the power amplifier 17, in accordance with the decision of the mode-switching decision section 18. The detector 29: conducts an operation at the switching timing of the operation mode of the power amplifier 17; detects an output from the distributor 28; and outputs a voltage value, which is proportional to an output power of the distributor 28, to the comparing section 27.

The comparing section 27 compares a detected voltage $V_{det0}$ of the detector 29 detected before mode switching and a detected voltage $V_{det1}$ of the detector 29 immediate after mode switching, and outputs a difference $\Delta V_{det}$ of these detected voltages to the gain controller 20. Based on the power information $S_p$ and the difference $\Delta V_{det}$ outputted from the comparing section 27, the gain controller 20 calculates a gain $G_1$ of the first variable gain amplifier 13 and a gain $G_2$ of the second variable gain amplifier 14, in order to have an output power of the power amplifier 17 converge to a specified output level. Because of a predefined calculation that utilizes the power information $S_p$ and the difference $\Delta V_{det}$ outputted from the comparing section 27, the gain controller 20 can calculate the gain $G_1$ and the gain $G_2$. Otherwise, the gain controller 20 can also calculate the gain $G_1$ and the gain $G_2$ by referencing a look-up table (LUT). However, in this case, the optimum gain $G_1$ and gain $G_2$, which correspond to the power information $S_p$ and difference $\Delta V_{det}$ outputted from the comparing section 27, are configured in the look-up table in advance.

The first variable gain amplifier 13 amplifies the amplitude signal in accordance with the gain $G_1$ outputted from the gain controller 20. The second variable gain amplifier 14 amplifies the phase modulation signal in accordance with the gain $G_2$ outputted from the gain controller 20. As a result, the transmission circuit 1 can prevent an output power from fluctuating discontinuously when the operation mode of the power amplifier 17 is switched.

As described above, when switching from the first bias circuit 24 to the second bias circuit 25, it is necessary for either one of the conditions, $t_1+d_1>t_2+d_2$ or $t_1+\min(d_1)>t_2+\max(d_2)$, to be satisfied in order to prevent the transistor for amplification 171 from entering a non-bias state. Additionally, when switching from the second bias circuit 25 to the first bias circuit 24, it is necessary for either one of the conditions, $t_1+d_1<t_2+d_2$ or $t_1+\max(d_1)<t_2+\min(d_2)$, to be satisfied.

Furthermore, when an output power of the transmission circuit 1 is detected by using the power control loop and the like, in order to detect the output power precisely, it is necessary for the switching of the bias circuit 24 and the bias circuit 25 to be completed before the output power is detected. Here, Td is a time period from the start of the switching of the bias circuit 24 and the bias circuit 25, to the start of the detection of the output power. For example, Td is a time period from the start of the switching of the bias circuit 24 and the bias circuit 25 until the detector 29 detects the output power. In this case, when switching from the first bias circuit 24 to the second bias circuit 25, it is necessary for either one of the conditions, $Td>t_1+d_1>t_2+d_2$ or $Td>t_1+\min(d_1)>t_2+\max(d_2)$, to be satisfied. Additionally, when switching from the second bias circuit 25 to the first bias circuit 24, it is necessary for either one of the conditions, $t_1+d_1<t_2+d_2<Td$ or $t_1+\max(d_1)<t_2+\min(d_2)<Td$, to be satisfied.

Not only at the switching timing of the operation mode of the power amplifier 17 as described above, but the power control loop may also conduct operations at timings described in the following.

For example, the power control loop may conduct an operation at a changing timing of the output power of the power amplifier 17. In this case, the power information $S_p$ is inputted into the detector 29. The detector 29 detects the changing timing of the output power of the power amplifier 17 based on the power information $S_p$. The detector 29: conducts the operation at the changing timing of the output power; detects an output from the distributor 28; and outputs a voltage value, which is proportional to the output power of the distributor 28, to the comparing section 27. The comparing section 27 compares a detected voltage $V_{det0}$ of the detector 29 detected before changing the output power and a detected voltage $V_{det1}$ of the detector 29 after the output power is changed, and outputs a difference $\Delta V_{det}$ of these detected voltages to the gain controller 20. The rest of the operation is identical to those described above. With the configuration described above, the transmission circuit 1 can prevent the output power from fluctuating discontinuously, even when the output power of the power amplifier 17 is changed.

Furthermore, not only at the timing of switching the operation mode or at the timing of changing the output power of the power amplifier 17, but the power control loop may also be operated in real time. However, one of the drawbacks of operating the power control loop in real time is the larger power consumption of the transmission circuit 1.

The power control loop is not an essential component of the transmission circuit 1. This is because, by using the transmission circuit 1 according to the first embodiment, the transistor for amplification 171 can be prevented from entering a non-bias state when switching the operation mode of the power amplifier 17 even if the power control loop is not included.

As described above, by using the transmission circuit 1 according to the first embodiment of the present invention, the transistor for amplification 171 can be prevented from entering a non-bias state, by adjusting the switching timing of the bias circuit when switching the operation mode of the power amplifier 17. As a result, the transmission circuit 1 can conduct the switching of the operation mode of the power amplifier 17 smoothly, while preventing the output signal of the power amplifier 17 from being interrupted when switching the operation mode of the power amplifier 17.

Furthermore, when switching the operation mode of the power amplifier 17, the detector 29 can quickly detect a fluctuation of the output power of the power amplifier 17, since the output signal of the power amplifier 17, which is a return signal, is not interrupted. As a result, the transmission circuit 1 can suppress, in a short period of time, the output power from fluctuating discontinuously in association with the switching of the operation mode of the power amplifier 17.

Second Embodiment

Figure 5:
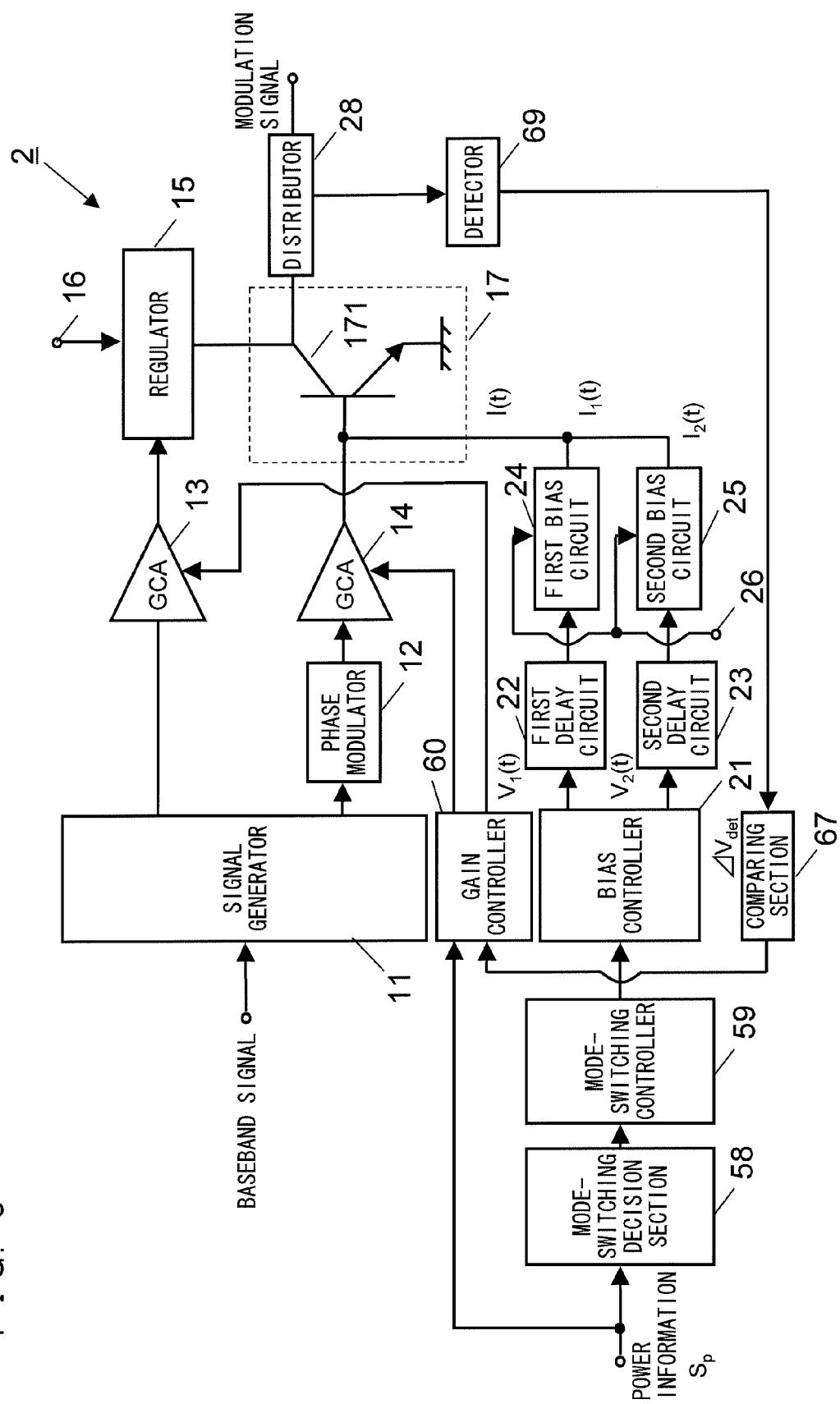
FIG. 5 is a block diagram showing one configuration example of a transmission circuit 2 according to a second embodiment of the present invention.

FIG. 5 is a block diagram showing one configuration example of a transmission circuit 2 according to a second embodiment of the present invention. The transmission circuit 2 in FIG. 5 includes: the signal generator 11; the phase modulator 12; the first variable gain amplifier (GCA) 13; the second variable gain amplifier (GCA) 14; the regulator 15; the power supply terminal 16; the power amplifier 17; a mode-switching decision section 58; a mode-switching controller 59; a gain controller 60; the bias controller 21; the first delay circuit 22; the second delay circuit 23; the first bias circuit 24; the second bias circuit 25; the power supply terminal 26; a comparing section 67; the distributor 28; and a detector 69. The power amplifier 17 includes the transistor for amplification 171.

When compared to the transmission circuit 1 according to the first embodiment, the characteristic of the transmission circuit 2 according to the second embodiment is conducting the operation by switching the operation mode of the power amplifier 17 between a compressed mode and a non-compressed mode. More specifically, the transmission circuit 2 is operated in the compressed mode of the power amplifier 17, during a period when a high transmission power is required and when the power amplifier 17 can be operated in a saturation range. On the other hand, the transmission circuit 2 is operated in the non-compressed mode of the power amplifier 17, during a period when a low transmission power is required and when the power amplifier 17 cannot be operated in the saturation range. The transmission circuit 2 can control the output power in a broad dynamic range, by conducting the operation by switching the operation mode of the power amplifier 17 between the compressed mode and the non-compressed mode.

Figure 6:
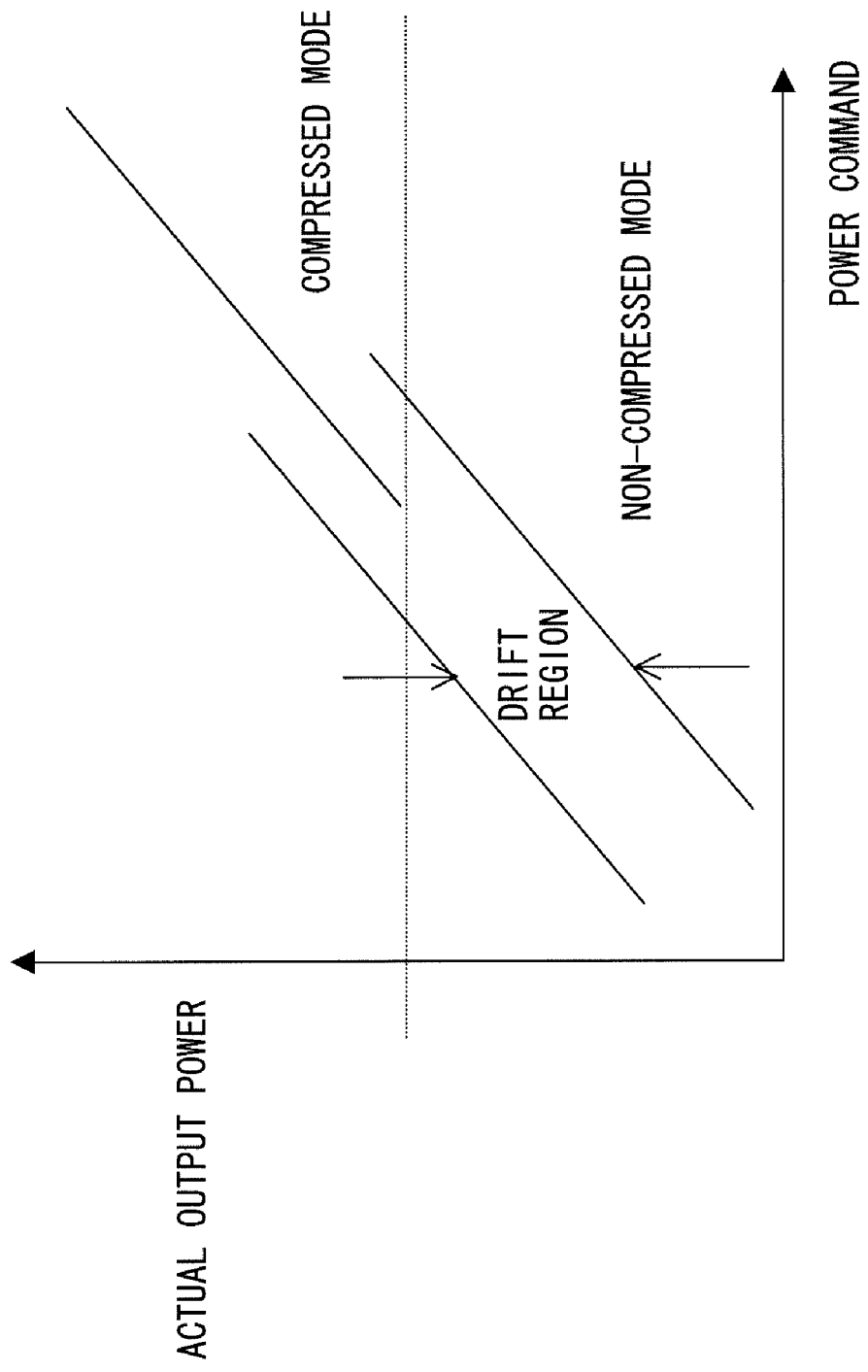
FIG. 6 is a figure showing one example of an output power characteristic of a power amplifier 17 when switched between a compressed mode and a non-compressed mode without operating a power control loop.

FIG. 6 is a figure showing one example of an output power characteristic of the power amplifier 17 when switched between the compressed mode and the non-compressed mode without operating the power control loop. In FIG. 6, the horizontal axis represents an output power of the power amplifier 17 outputted in accordance with an instruction of a transmission power control (TPC) command. For example, in a W-CDMA system, the transmission power control command is transmitted from the base station according to the power information $S_p$. The vertical axis represents an actual output power of the power amplifier 17.

One characteristics of the output power in the non-compressed mode is a tendency to fluctuate due to various factors, and when switching is conducted between the compressed mode and the non-compressed mode without conducting a power control, there is a high possibility that the output power of the power amplifier 17 becomes discontinuous as shown in FIG. 6. Therefore, the transmission circuit 2 can generate a fluctuation of the output power exceeding a maximum of 5 dB when the operation is conducted by switching the operation mode of the power amplifier 17 between the compressed mode and the non-compressed mode, as a result of characteristics difference of each mode (temperature fluctuation, fluctuation due to aging degradation, load fluctuation, and the like).

Under the W-CDMA specification, in between two symbols, the output of the power amplifier 17 is changed to a specified output power level. However, within a predefined time period before and after a symbol boundary (for example, 25 μsec before and after a symbol boundary), there are no provisions regarding the output power level, and it is not necessary for the output power level to stay within an acceptable value range with regard to a specified output power. Therefore, in the current embodiment, when switching the operation mode of the power amplifier 17 between the compressed mode and the non-compressed mode, the output of the power amplifier 17 is converged in the specified output power level within the predefined time period that includes the symbol boundary, by using the power control loop described above.

A description of the operation of the transmission circuit 2 is provided in the following.

Description of the operations of: the signal generator 11; the phase modulator 12; the first variable gain amplifier 13; the second variable gain amplifier 14; the regulator 15; the power supply terminal 16; and the power amplifier 17 are omitted, since they are similar to those in the first embodiment.

The mode-switching decision section 58 decides whether to operate the power amplifier 17 in the compressed mode or in the non-compressed mode, depending on the inputted power information $S_p$. For example, by referencing a look-up table (for example, refer FIG. 7A) that describes a relationship between the power information $S_p$ and the operation mode, the mode-switching decision section 58 determines whether to operate the power amplifier 17 in the compressed mode or in the non-compressed mode.

Furthermore, the mode-switching decision section 58 may decide whether or not to switch the operation mode of the power amplifier 17 by comparing the value of the power information $S_p$ to a predefined threshold. For example, the mode-switching decision section 58 can decide to operate the power amplifier 17: in the non-compressed mode if the value of the power information $S_p$ is less than the predefined threshold; or in the compressed mode if the value of the power information $S_p$ is equal to or more than the predefined threshold. The threshold that is compared to the power information $S_p$ is not limited to a single threshold, and a plurality of thresholds may be applied. If the number of the operation mode after switching is assumed as N, when the mode-switching decision section 58 decides to switch the operation mode; the mode-switching decision section 58 outputs the mode-switching signal $S_M(N)$, and provides the mode-switching controller 59 with this mode-switching signal $S_M(N)$. In this example, mode number "1" is assigned to the non-compressed mode, and mode number "2" is assigned to the compressed mode.

In the description above, the mode-switching decision section 58 decides to switch the operation mode of the power amplifier 17 based on the power information $S_p$; however, the mode-switching decision section 58 may decide based on any other information. For example, the mode-switching decision section 58 may decide to switch the operation mode of the power amplifier 17 based on information such as, the type of the modulation signal, temperature, and the like.

The mode-switching controller 59 switches the bias circuit to be operated, depending on a decision of the mode-switching decision section 58. For example, the mode-switching controller 59 determines the bias circuit that corresponds to the mode-switching signal $S_M(N)$ which is provided by the mode-switching decision section 58, by using a look-up table (for example, refer FIG. 7B); and outputs a bias switching signal $S_B$. The mode-switching controller 59 outputs the bias switching signal $S_B(1)$ when the first bias circuit 24 is to be turned on, and outputs the bias switching signal $S_B(2)$ when the second bias circuit 25 is to be turned on.

In the example described above, the first bias circuit 24 is used in the non-compressed mode and the second bias circuit 25 is used in the compressed mode; however, the usage of the bias circuit is not limited to this example. For example, even when the second bias circuit 25 is used in the compressed mode, the usage of the bias circuit may be switched from the second bias circuit 25 to the first bias circuit 24 if the output power becomes higher than a certain threshold. In addition, even when the first bias circuit 24 is used in the non-compressed mode, the usage of the bias circuit may be switched from the first bias circuit 24 to the second bias circuit 25 if the output power becomes lower than a certain threshold. The switching of these bias circuits is determined based on a relationship between electrical power efficiency and distortion of the power amplifier 17.

Description of the operations of: the bias controller 21; the first delay circuit 22; the second delay circuit 23; the first bias circuit 24; the second bias circuit 25; and the power supply terminal 26 are omitted, since they are similar to those in the first embodiment. The first bias circuit 24 supplies the base terminal of the transistor for amplification 171 in the power amplifier 17 with, for example, a bias current of 1 mA. The second bias circuit 25 supplies the base terminal of the transistor for amplification 171 in the power amplifier 17 with, for example, a bias current of 0.5 mA.

Described next is an operation of a power control loop that includes the distributor 28, the detector 69, the comparing section 67, and the gain controller 60. When switching the operation mode of the power amplifier 17 to the compressed mode or to the non-compressed mode, the power control loop conducts an operation to prevent the output power of the transmission circuit 2 (i.e. power amplifier 17) from fluctuating discontinuously. In this case, for example, the power information $S_p$ is inputted into the detector 69. The detector 69 detects a switching timing of the operation mode of the power amplifier 17 based on the power information $S_p$. The detector 69 may detect the switching timing of the operation mode of the power amplifier 17 in accordance with the decision of the mode-switching decision section 58. The detector 69: conducts an operation at the switching timing of the operation mode of the power amplifier 17; detects an output from the distributor 28; and outputs a voltage value, which is proportional to an output power of the distributor 28, to the comparing section 67.

The comparing section 67 compares a detected voltage $V_{det0}$ of the detector 69 detected before mode switching and a detected voltage $V_{det1}$ of the detector 69 immediate after mode switching, and outputs a difference $\Delta V_{det}$ of these detected voltages to the gain controller 60. Based on the power information $S_p$ and the difference $\Delta V_{det}$ outputted from the comparing section 67, the gain controller 60 calculates a gain $G_1$ of the first variable gain amplifier 13 and a gain $G_2$ of the second variable gain amplifier 14, such that the output of the power amplifier 17 converges to a specified output power level. Because of a predefined calculation that utilizes the power information $S_p$ and the difference $\Delta V_{det}$ outputted from the comparing section 67, the gain controller 60 can calculate the gain $G_1$ and the gain $G_2$. Otherwise, the gain controller 60 can also calculate the gain $G_1$ and the gain $G_2$ by referencing a look-up table (LUT). However, in this case, the optimum gain $G_1$ and gain $G_2$, which correspond to the power information $S_p$ and difference $\Delta V_{det}$ outputted from the comparing section 67, are configured in the look-up table in advance.

The first variable gain amplifier 13 amplifies the amplitude signal in accordance with the gain $G_1$ outputted from the gain controller 60. The second variable gain amplifier 14 amplifies the phase modulation signal in accordance with the gain $G_2$ outputted from the gain controller 60. As a result, the transmission circuit 2 can prevent the output power from fluctuating discontinuously when the operation mode of the power amplifier 17 is switched to the compressed mode or the non-compressed mode.

Figure 8A:
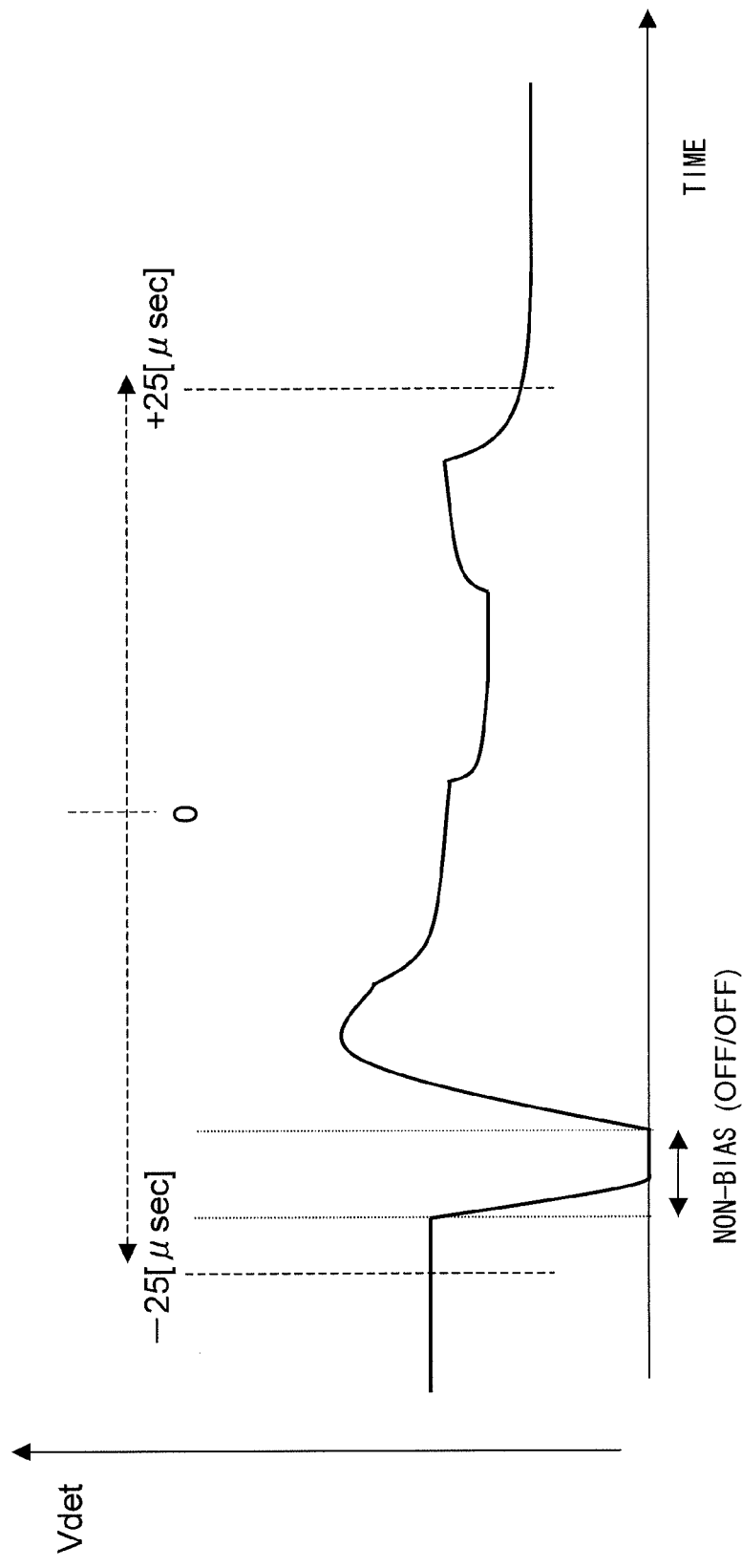
FIG. 8A is a figure showing a transition of the output power of the transmission circuit 2 when a transistor for amplification 171 enters a non-bias state.
Figure 8B:
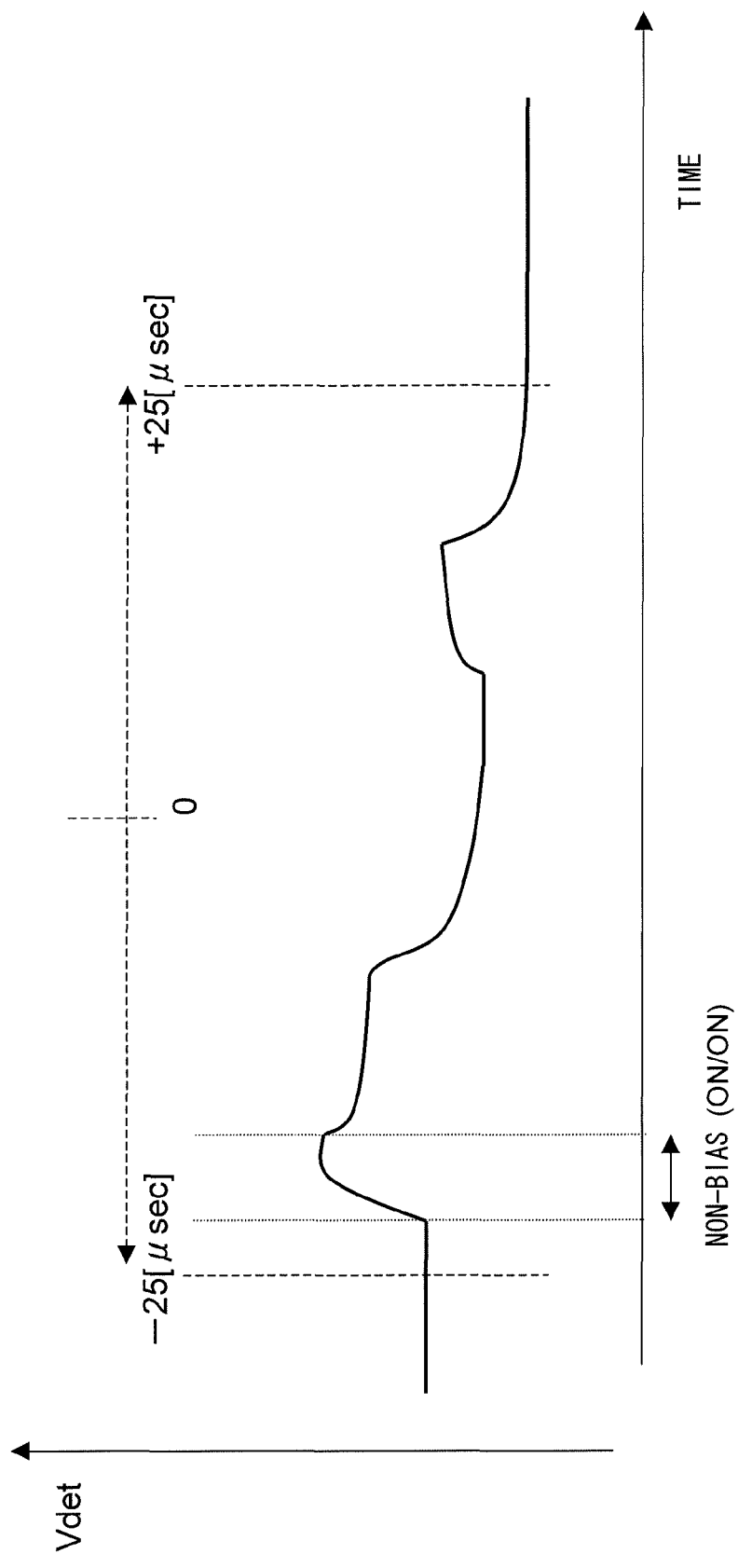
FIG. 8B is a figure showing a transition of the output power of the transmission circuit 2 when the transistor for amplification 171 does not enter a non-bias state.

In the following, an example, where the operation mode of the power amplifier 17 is switched between the compressed mode and the non-compressed mode under the W-CDMA specification, is shown; and an advantageous effect of the current embodiment is described. FIG. 8A is a figure showing a transition of the output power of the transmission circuit 2 when the transistor for amplification 171 enters a non-bias state as a result of not adjusting the switching timing of the bias circuit. FIG. 8B is a figure showing a transition of the output power of the transmission circuit 2 when the transistor for amplification 171 does not enter a non-bias state as a result of adjusting the switching timing of the bias circuit. In FIG. 8A and FIG. 8B, the boundary between symbols is set at 0 μsec.

As described above, under the W-CDMA specification, it is necessary to change the output of the power amplifier 17 to a specified output power level within a predefined time period (for example, 25 μsec) before and after a symbol boundary. As shown in FIG. 8A, when the switching timing of the bias circuit is not adjusted, a period in which the transistor for amplification 171 enters a non-bias state occurs, and the output signal of the power amplifier 17 is momentarily interrupted. As a result, start-up of the detector 29 that detects the output power of the power amplifier 17 lags behind, leading to a possibility that the output of the power amplifier 17 does not converges to a specified output power level within a predefined time period before and after the symbol boundary. On the other hand, as shown in FIG. 8B, the output signal of the power amplifier 17 can be prevented from momentarily being interrupted, when the switching timing of the bias circuit is adjust such that the transistor for amplification 171 does not enter a non-bias state. As a result, the detector 29 that detects the output power of the power amplifier 17 starts up immediately, leading to a high possibility that the output of the power amplifier 17 converges to a specified output power level within a predefined time period before and after the symbol boundary.

As described above, by using the transmission circuit 2 according to the second embodiment of the present invention, the transistor for amplification 171 can be prevented from entering a non-bias state, by adjusting the switching timing of the bias circuit when switching the operation mode of the power amplifier 17 between the compressed mode and the non-compressed mode. As a result, the transmission circuit 2 can conduct the switching of the operation mode of the power amplifier 17 smoothly, while preventing the output signal of the power amplifier 17 from being interrupted when switching the operation mode of the power amplifier 17 between the compressed mode and the non-compressed mode.

Furthermore, when switching the operation mode of the power amplifier 17 between the compressed mode and the non-compressed mode, the detector 69 can quickly detect a fluctuation of the output power of the power amplifier 17, since the output signal of the power amplifier 17 is not interrupted. As a result, the power control loop can suppress, in a short period of time, the output power of the transmission circuit 2 from fluctuating discontinuously in association with the switching of the operation mode of the power amplifier 17.

Third Embodiment

Figure 9:
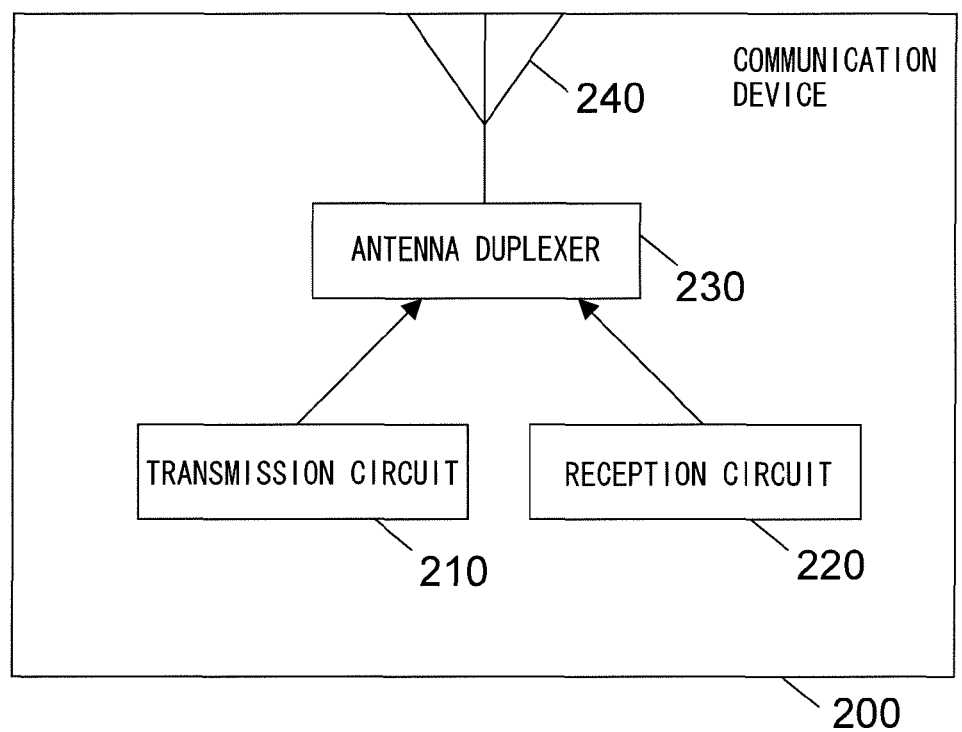
FIG. 9 is a block diagram showing one configuration example of a communication device according to a third embodiment of the present invention.
Figure 10:
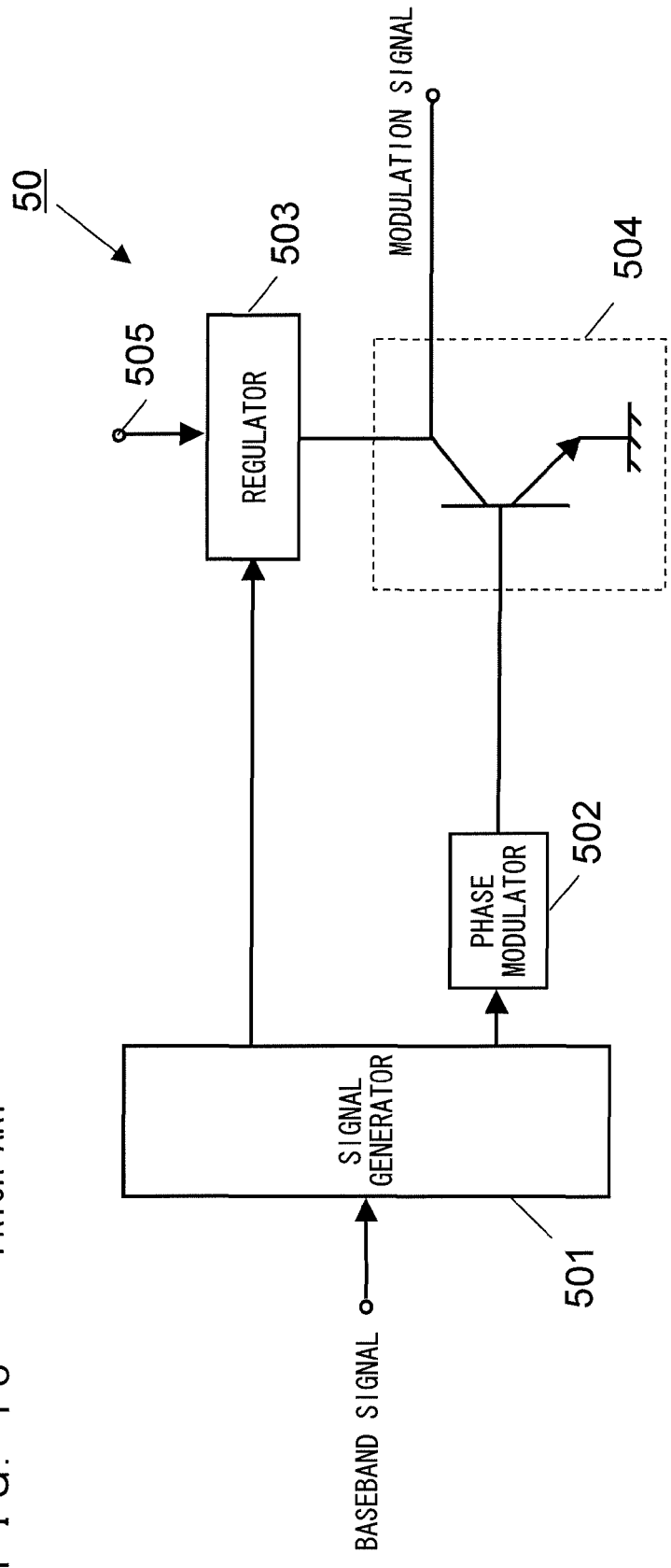
FIG. 10 is a block diagram showing one configuration example of a conventional transmission circuit 50.
Figure 11:
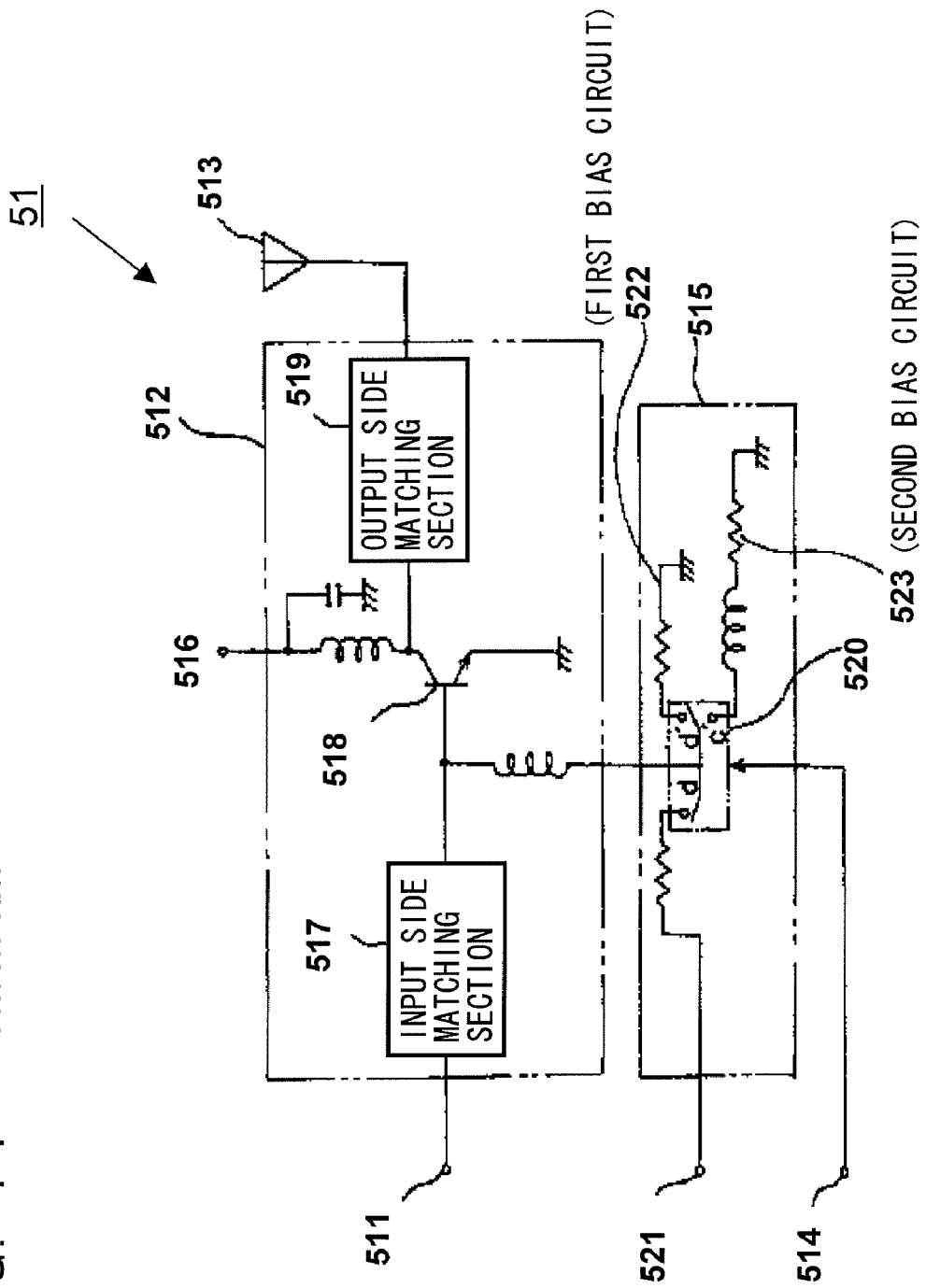
FIG. 11 is a block diagram showing one configuration example of a transmission circuit 51 that uses a conventional high-frequency wave amplifier.
Figure 12:
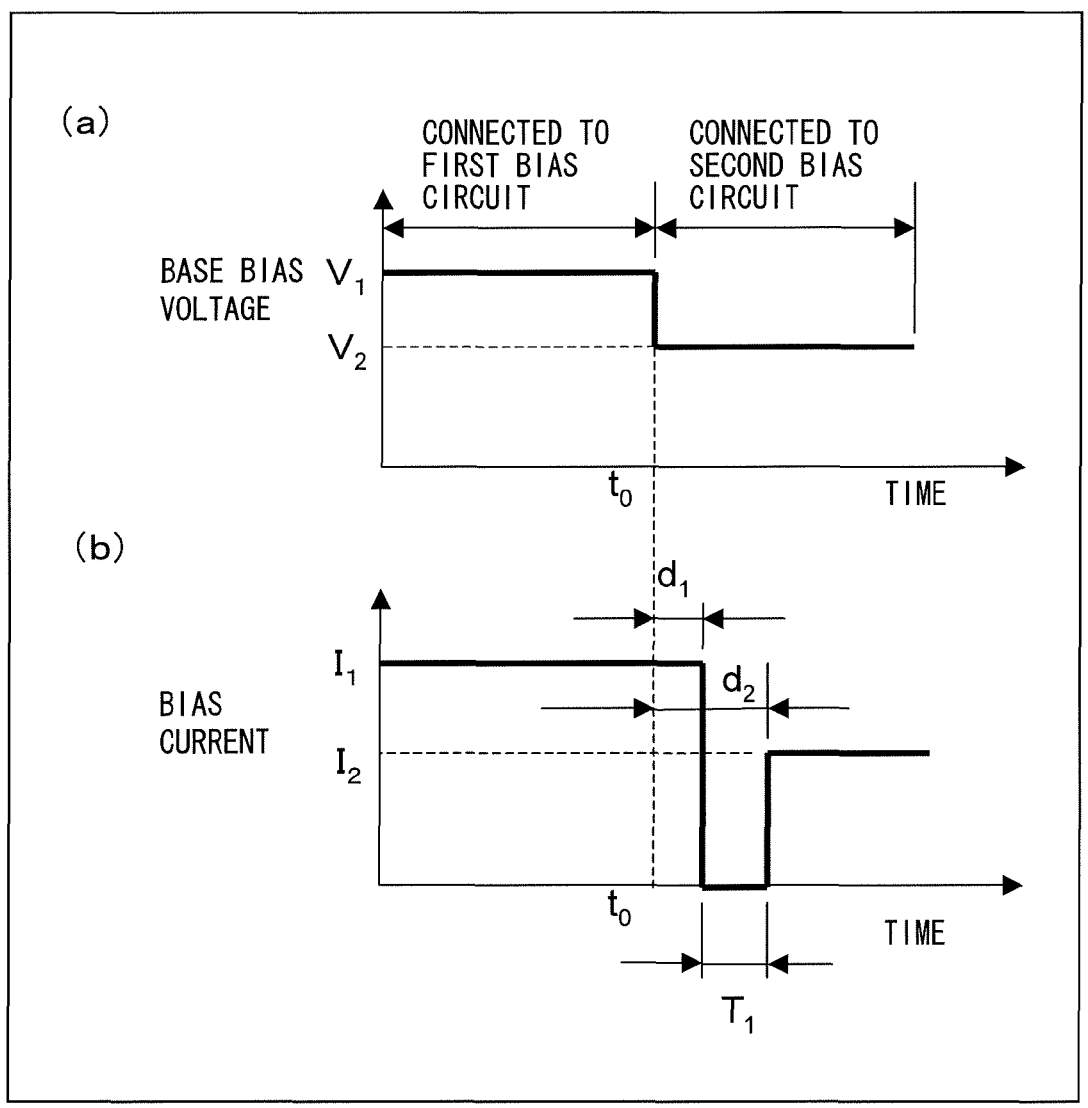
FIG. 12 is a figure that describes a switching operation during bias circuit switching.

FIG. 9 is a block diagram showing one configuration example of a communication device according to a third embodiment of the present invention. The communication device 200 according to the third embodiment in FIG. 9 includes: a transmission circuit 210; a reception circuit 220; an antenna duplexer 230; and an antenna 240. The transmission circuit 210 is the transmission circuit described above in either the first or the second embodiment. The antenna duplexer 230 transmits a transmission signal outputted from the transmission circuit 210 to the antenna 240, and prevents the transmission signal from leaking into the reception circuit 220. Furthermore, the antenna duplexer 230 transmits a reception signal inputted from the antenna 240 to the reception circuit 220, and prevents the reception signal from leaking into the transmission circuit 210. As a result, the transmission signal is outputted from the transmission circuit 210 and released out into open space from the antenna 240 via the antenna duplexer 230.

The reception signal is received by the antenna 240; and then transferred to the reception circuit 220 via the antenna duplexer 230. By using the transmission circuit according to the first or second embodiment, the communication device 200 according to the third embodiment can obtain linearity of the transmission signal and can attain a low distortion wireless device. Moreover, since the output of the transmission circuit 210 is not branched out to a directional coupler and the like, it is possible to reduce a loss that occurs in between the transmission circuit 210 and the antenna 240, which enables reduction in the power consumption at the time of transmission, allowing a prolonged usage as a wireless communication device. The communication device 200 may have a configuration that includes only the transmission circuit 210 and the antenna 240.

The transmission circuit according to the present invention is useful as a transmission circuit which is used as a communication device such as, a mobile phone, a wireless LAN, and the like.

While the invention has been described in detail, the foregoing description is in all aspects illustrative and not restrictive. It is understood that numerous other modifications and variations can be devised without departing from the scope of the invention.

What is claimed is:

1. A transmission circuit that outputs a transmission signal, the transmission circuit comprising:
a signal generator that generates an amplitude signal and a phase signal;
a first variable gain amplifier that amplifies the amplitude signal by a first gain;
a regulator that outputs a voltage depending on the amplitude signal that is inputted via the first variable gain amplifier;
a phase modulator that conducts phase modulation on the phase signal and outputs a phase modulation signal;
a second variable gain amplifier that amplifies the phase modulation signal by a second gain;
a power amplifier that outputs a transmission signal by amplifying the phase modulation signal inputted via the second variable gain amplifier depending on the voltage outputted from the regulator;
a first bias circuit that supplies the power amplifier with a first bias signal;
a second bias circuit that supplies the power amplifier with a second bias signal;
a bias controller that controls operations of the first bias circuit and the second bias circuit;
a mode-switching decision section that decides whether or not to switch an operation mode of the power amplifier based on power information;
a mode-switching controller that instructs the bias controller to switch the operations of the first bias circuit and the second bias circuit depending on a decision of the mode-switching decision section;
a first delay circuit that delays switching of an operation of the first bias circuit for a first delay time $t_1$; and
a second delay circuit that delays switching of an operation of the second bias circuit for a second delay time $t_2$, and
the power amplifier comprises a transistor for amplification, which amplifies the phase modulation signal, and
the first delay time and the second delay time are configured such that both the first bias circuit and the second bias circuit operate simultaneously for a predefined time period when switching the operation mode of the power amplifier,
wherein when the minimum value of a delay time $d_1$, which is the time that elapses when an electrical signal travels through a pathway from the bias controller to a base terminal of the transistor for amplification via the first bias circuit not including the first delay circuit, is defined as $\min(d_1)$, and when the maximum value of a delay time $d_2$, which is the time that elapses when an electrical signal travels through a pathway from the bias controller to the base terminal of the transistor for amplification via the second bias circuit not including the second delay circuit, is defined as $\max(d_2)$:
the first delay time $t_1$ and the second delay time $t_2$ are configured so as to satisfy Formula 1 when switching from the first bias circuit to the second bias circuit $$t_1+\min(d_1)>t_2+\max(d_2) \qquad \text{(Formula 1)}.$$

2. A transmission circuit that outputs a transmission signal, the transmission circuit comprising:
a signal generator that generates an amplitude signal and a phase signal;
a first variable gain amplifier that amplifies the amplitude signal by a first gain;
a regulator that outputs a voltage depending on the amplitude signal that is inputted via the first variable gain amplifier;
a phase modulator that conducts phase modulation on the phase signal and outputs a phase modulation signal;
a second variable gain amplifier that amplifies the phase modulation signal by a second gain;
a power amplifier that outputs a transmission signal by amplifying the phase modulation signal inputted via the second variable gain amplifier depending on the voltage outputted from the regulator;
a first bias circuit that supplies the power amplifier with a first bias signal;
a second bias circuit that supplies the power amplifier with a second bias signal;
a bias controller that controls operations of the first bias circuit and the second bias circuit;

a mode-switching decision section that decides whether or not to switch an operation mode of the power amplifier based on power information;

a mode-switching controller that instructs the bias controller to switch the operations of the first bias circuit and the second bias circuit depending on a decision of the mode-switching decision section;

a first delay circuit that delays switching of an operation of the first bias circuit for a first delay time $t_1$; and a second delay circuit that delays switching of an operation of the second bias circuit for a second delay time $t_2$; and the power amplifier comprises a transistor for amplification, which amplifies the phase modulation signal, and the first delay time and the second delay time are configured such that both the first bias circuit and the second bias circuit operate simultaneously for a predefined time period when switching the operation mode of the power amplifier, wherein when the maximum value of a delay time $d_1$, which is the time that elapses when an electrical signal travels through a pathway from the bias controller to the base terminal of the transistor for amplification via the first bias circuit not including the first delay circuit, is defined as $max(d_1)$, and when the minimum value of a delay time $d_2$, which is the time that elapses when an electrical signal travels through a pathway from the bias controller to the base terminal of the transistor for amplification via the second bias circuit not including the second delay circuit, defined as $min(d_2)$:

the first delay time $t_1$ and the second delay time $t_2$ are configured so as to satisfy Formula 2 when switching from the second bias circuit to the first bias circuit $$t_1 + max(d_1) < t_2 + min(d_2) \qquad \text{(Formula 2)}.$$

3. A transmission circuit that outputs a transmission signal, the transmission circuit comprising:

a signal generator that generates an amplitude signal and a phase signal;

a first variable gain amplifier that amplifies the amplitude signal by a first gain;

a regulator that outputs a voltage depending on the amplitude signal that is inputted via the first variable gain amplifier;

a phase modulator that conducts phase modulation on the phase signal and outputs a phase modulation signal;

a second variable gain amplifier that amplifies the phase modulation signal by a second gain;

a power amplifier that outputs a transmission signal by amplifying the phase modulation signal inputted via the second variable gain amplifier depending on the voltage outputted from the regulator;

a first bias circuit that supplies the power amplifier with a first bias signal;

a second bias circuit that supplies the power amplifier with a second bias signal;

a bias controller that controls operations of the first bias circuit and the second bias circuit;

a mode-switching decision section that decides whether or not to switch an operation mode of the power amplifier based on power information;

a mode-switching controller that instructs the bias controller to switch the operations of the first bias circuit and the second bias circuit depending on a decision of the mode-switching decision section;

a first delay circuit that delays switching of an operation of the first bias circuit for a first delay time $t_1$; and a second delay circuit that delays switching of an operation of the second bias circuit for a second delay $t_2$, and the power amplifier comprises a transistor for amplification, which amplifies the phase modulation signal, and the first delay time and the second delay time are configured such that both the first bias circuit and the second bias circuit operate simultaneously for a predefined time period when switching the operation mode of the power amplifier, and the transmission circuit further includes a power control loop that prevents an output power of the power amplifier from fluctuating when switching the operation mode of the power amplifier, and the power control loop comprises:

a distributor that distributes a transmission signal outputted from the power amplifier;

a detector that detects an output power of the distributor and outputs a voltage value proportional to the output power when switching the operation mode of the power amplifier;

a comparing section that compares a voltage value outputted by the detector before switching the operation mode of the power amplifier and a voltage value outputted by the detector when switching the operation mode of the power amplifier, and outputs a difference of these voltage values; and a gain controller that calculates the first gain and the second gain based on the difference outputted by the comparing section and the power information, in order to have the output power of the power amplifier converge to a specified output power level, wherein the power control loop allows the output power of the power amplifier to converge to a specified output power level within a certain period of time before and after a symbol boundary, when switching the operation mode of the power amplifier.

\* \* \* \* \*